United States Patent
Yamamoto et al.

(10) Patent No.: US 7,417,507 B2
(45) Date of Patent: Aug. 26, 2008

(54) BIAS CIRCUIT FOR POWER AMPLIFIER HAVING A LOW DEGRADATION IN DISTORTION CHARACTERISTICS

(75) Inventors: Kazuya Yamamoto, Tokyo (JP); Tomoyuki Asada, Tokyo (JP); Hiroyuki Otsuka, Hyogo (JP); Kosei Maemura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 91 days.

(21) Appl. No.: 11/556,257

(22) Filed: Nov. 3, 2006

(65) Prior Publication Data

US 2007/0273447 A1    Nov. 29, 2007

(30) Foreign Application Priority Data

May 26, 2006    (JP)    ............................... 2006-146061

(51) Int. Cl.
*H03F 3/04*    (2006.01)
(52) U.S. Cl. ........................................ 330/296; 330/289
(58) Field of Classification Search .................. 330/285, 330/289, 296
See application file for complete search history.

(56) References Cited

U.S. PATENT DOCUMENTS 6,549,076 B2    4/2003    Kuriyama
6,946,913 B2    9/2005    Moriwaki et al.
7,009,453 B2 *    3/2006    Kuriyama .................... 330/296
2005/0062541 A1    3/2005    Kuriyama

FOREIGN PATENT DOCUMENTS

| EP | 1 195 890 | 4/2002 |
|---|---|---|
| EP | 1 515 434 | 3/2005 |
| JP | 11-68469 | 3/1999 |
| JP | 2003-229728 | 8/2003 |
| JP | 2004-343244 | 12/2004 |

OTHER PUBLICATIONS

U.S. Appl. No. 11/552,635, filed Oct. 25, 2006, Yamamoto et al.

* cited by examiner

*Primary Examiner*—Khanh V Nguyen
(74) *Attorney, Agent, or Firm*—Leydig, Voit & Mayer, Ltd.

(57) ABSTRACT

A combined bias circuit in which a voltage drive bias circuit and a current drive bias circuit are provided in parallel with each other has a configuration in which a linearizer including a first resistor is connected between an amplifying transistor and a second resistor. This configuration ensures that even when a low voltage of 2.4 to 2.5 V is supplied as an external reference voltage, the amplifying operation can be performed while generally constantly maintaining an idling current in a temperature range from a low temperature to a high temperature, and that degradation in distortion characteristics during low-temperature operation can be limited.

13 Claims, 7 Drawing Sheets

BIAS CIRCUIT FOR POWER AMPLIFIER HAVING A LOW DEGRADATION IN DISTORTION CHARACTERISTICS

BACKGROUND OF THE INVENTION

1. Field of the Invention

The present invention relates to a bias circuit for a power amplifier and, more particularly, to a bias circuit including an emitter follower and capable of operating by a low external reference voltage a power amplifier formed on a GaAs chip integrally with the bias circuit.

2. Background Art

In recent years, a GaAs-HBT power amplifier (HBT: heterojunction bipolar transistor) is being widely used as a power amplifier for portable telephones in code division multiple access (CDMA) systems or other systems, or as a wireless LAN power amplifier.

For example, in Japanese Unexamined Patent Publication No. 2004-343244, a circuit formed as a conventional GaAs-HBT power amplifier module is disclosed.

FIG. 11 shows an example of a circuit formed as a conventional GaAs-HBT power amplifier module. A portion surrounded by the broken line is formed on a GaAs chip. Other portions are formed of chip parts and lines on the module substrate.

The circuit shown in FIG. 11 has an RF signal input terminal (IN) and an RF signal output terminal (OUT). Tr1 and Tr2 respectively denote heterojunction bipolar transistors (HBTs) in initial and final stages. Vc1 and Vc2 respectively denote terminals for power supply to the collectors of the transistors Tr1 and Tr2. Vcb denotes a terminal for power supply to a bias circuit for the transistors Tr1 and Tr2. Rb1, Rb2, Rb12 and Rb22 denote resistors. C1 to C4, C21 to C23, Cd1, Cd2 and Cdb denote capacitors. L1 and L2 denote inductors. L11 and L21 to L23 denote lines having particular electrical lengths and functioning as inductors.

FIG. 12 shows a concrete example of a circuit configuration of the final stage transistor Tr2 and the bias circuit section for this transistor. (The initial transistor Tr1 and the bias circuit section for the initial transistor Tr1 also have basically the same circuit configuration.) Trb1 to Trb5 denote HBTs. Rbb1 to Rbb6 denote resistors. Vrefb denotes a terminal for input of a reference voltage to the bias circuit (a terminal through which a reference voltage is externally supplied). Vcb denotes a collector power terminal for the bias circuit. Vbo denotes an output terminal of the bias circuit. The bias circuits for the Tr1 and Tr2 operates so as to constantly maintain the idling currents through the Tr1 and Tr2 of the power amplifier (bias currents when no RF signal input is supplied) under varying temperature For the normal operation of the bias circuit for the power amplifier shown in FIGS. 11 and 12, a reference voltage Vref higher than twice the barrier voltage of HBTs, typified that in a two-stage cascaded section formed of Trb4 and Trb5 in a diode connection or that in a two-stage cascaded section formed of the final stages Tr2 and Trb1, is required. That is, in a case where GaAs HBT is used, a Vref of about 2.7 to 2.9 V is required from consideration of a barrier voltage of about 1.25 to 1.30 V and a voltage drop across the resistor Rbb1 (about 0.2 to 0.3 V).

However, when Vref is reduced, for example, to a voltage of 2.5 V lower than twice the barrier voltage of the HBTs, an idling current cannot flow even at ordinary temperature and the bias circuit shown in FIGS. 11 and 12 is practically unusable unless it is modified. If the circuit operates at a lower temperature, the problem that an idling current cannot flow is more serious. This is because the barrier voltage determined by the device material is higher if the temperature is lower. Ordinarily, the barrier voltage has a gradient of about −1 to −2 mV/° C.

To solve the above-described problem, the inventors of the present invention have devised a circuit configured as shown in FIG. 13 and capable of operating at a low voltage: Vref=2.4 to 2.5 V. In this circuit shown in FIG. 13, Tr2a and Tr2b denote power transistors; Trb1 to Trb6, biasing transistors; Rbb1 to Rbb13, resistors; and C4 and Ca, capacitors. This circuit is characterized in that Tr2a has a line for injecting a current directly through the resistor Rbb9 (current drive) and a line for supplying a current through an emitter follower formed by Trb1 and Trb2 (voltage drive), and that Tr2b has only a line for injecting a current through the resistor Rbb13. If this circuit is used, power amplification at a low voltage: Vref=2.4 to 2.5 V can be performed.

In the current shown in FIG. 13, however, there is a possibility that, if factors including circuit constants are not sufficiently optimized, the gain (Gp) and distortion characteristics (ACP/ACLR) will degrade at a low temperature, as shown in FIG. 14, although there are no gain distortion problems at ordinary or high temperature. A reduction in gain Gp under such conditions has been experimentally observed in correspondence with degradations in distortion characteristics.

SUMMARY OF THE INVENTION

The present invention has been developed to solve the above-described problems, and therefore it is an object of the present invention to provide a bias circuit for a power amplifier designed so that a degradation in distortion characteristics at the time of operation at a low temperature is limited.

The above object is achieved by a bias circuit for power amplification that includes a first amplifying transistor, a voltage drive bias circuit connected to the base of the first amplifying transistor, a current drive bias circuit provided in parallel with the voltage drive bias circuit and connected to the base of the first amplifying transistor, a reference voltage input terminal connected to the voltage drive bias circuit and the current drive bias circuit to which a reference voltage is externally supplied, a first transistor included in the voltage drive bias circuit, supplying a bias current according to the reference voltage to the base of the first amplifying transistor, a second transistor included in the voltage drive bias circuit, having its collector connected to a point between the emitter of the first transistor and the base of the first amplifying transistor through a first resistor and having its emitter grounded, a third transistor included in the voltage drive bias circuit, having its base connected to the reference voltage input terminal through a second resistor, supplying a bias current according to the reference voltage to the base of the second transistor, a third resistor included in the voltage drive bias circuit, having its one end connected to the reference voltage input terminal, and having the other end connected to the base of the first amplifying transistor, a fourth resistor provided between the base of the first amplifying transistor and a connecting point between the third resistor and the first transistor, a linearizer including a fifth resistor, having its one end connected between the fourth resistor and the base of the first amplifying transistor, and having the other end connected to a grounding point, and when the base voltage applied from the reference voltage input terminal is lower than a threshold voltage at which the first transistor is operable, a first current is supplied from the reference voltage input terminal to the base of the first amplifying transistor through the current drive bias circuit, and when the base voltage applied from the reference voltage input terminal is equal to or higher than the threshold voltage, a second current is supplied from the reference voltage input terminal to the base of the first amplifying transistor through the voltage drive circuit in addition to the first current.

Other features and advantages of the invention will be apparent from the following description taken in connection with the accompanying drawings.

DETAILED DESCRIPTION OF THE PREFERRED EMBODIMENTS

Figure 1:
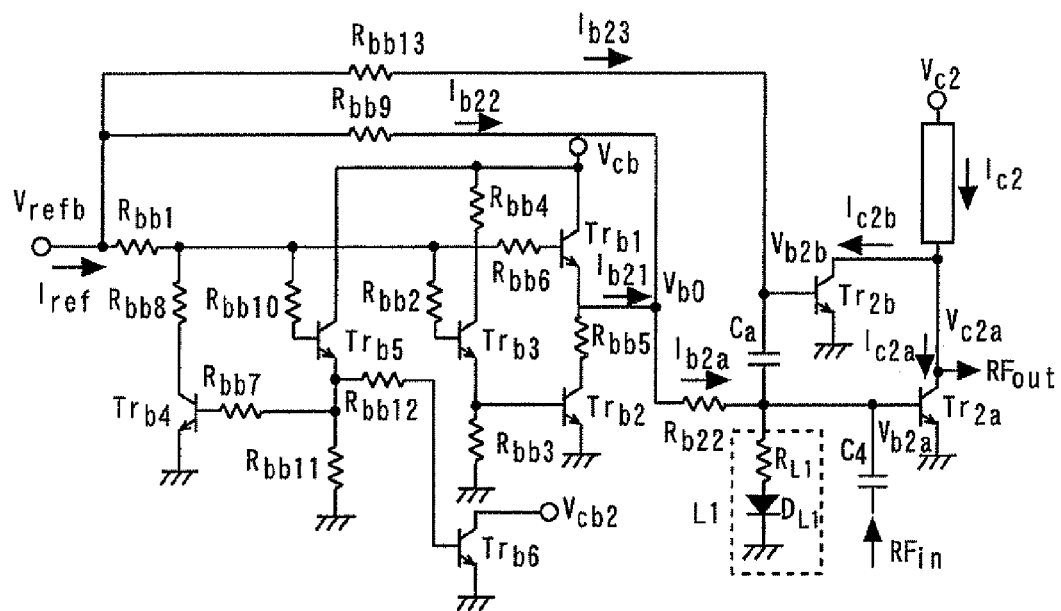
FIG. 1 shows a configuration of a power amplifier and a bias circuit for the power amplifier according to the first embodiment.

Embodiments of the present invention will be described below referring to the drawings. In the drawings, the same or equivalent parts will be denoted by the same reference numerals, and the description thereof will be simplified or omitted.

First Embodiment

FIG. 1 shows an example of a configuration of a power amplifier and a bias circuit for the power amplifier according to the first embodiment of the present invention. This circuit is configured by using GaAs-heterojunction bipolar transistors (GaAs-HBTs).

Figure 13:
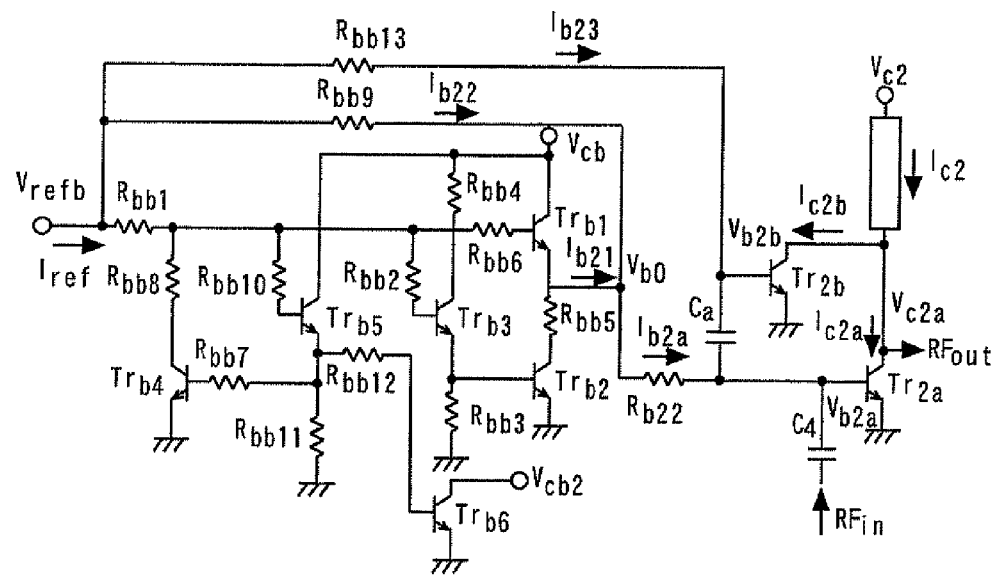
FIG. 13 shows a configuration of a power amplifier and a bias circuit for the power amplifier of the previous invention.

In the circuit configuration shown in FIG. 13, a voltage drive bias circuit, typified by an emitter follower, and a current drive bias circuit which directly applies a current from a reference voltage input terminal to a base via a high-resistance resistor, are provided in parallel with each other. That is, a combined bias circuit having a voltage drive bias circuit and a current drive bias circuit provided in parallel with each other is configured. This combined bias circuit drives the first amplifying transistor (hereinafter referred to as "Tr2a" or "Tr2"). The second amplifying transistor (hereinafter referred to as "Tr2b") is provided in parallel with Tr2a. Tr2b is driven only by the current drive bias circuit.

The circuit shown in FIG. 1 has a voltage drive bias circuit (a circuit including Trb1 to Trb6) connected to the base of Tr2a, as does the circuit shown in FIG. 13. A current drive bias circuit (a circuit including Rbb9) connected to the base of Tr2a is also provided in parallel with this voltage drive bias circuit. The voltage drive bias circuit and the current drive bias circuit are connected to a reference voltage input terminal to which a reference voltage is externally supplied (hereinafter referred to as "Vrefb").

In FIG. 1, Trb1 to Trb6 denote heterojunction bipolar transistors (HBTs); Rbb1 to Rbb22 and RL1 denote resistance elements; Vcb, Vcb2, Vrefb and Vc2 denote voltage input terminals (power terminals); Ca and C4 denote capacitance elements; and DL1 denotes a diode.

Description will next be made of the configuration of the voltage drive bias circuit shown in FIG. 1. The voltage drive bias circuit has the first to sixth transistors (Trb1 to Trb6) and resistance elements.

The base of the first transistor (hereinafter referred to simply as "Trb1") is connected to Vrefb through Rbb1 and Rbb6. A bias current according to the reference voltage can be supplied from Trb1 to the base of Tr2a.

The collector of the second transistor (hereinafter referred to simply as "Trb2") is connected to a connecting point between the emitter of Trb1 and the base of Tr2a through the first resistor Rbb5 (hereinafter referred to simply as "Rbb5").

The base of the third transistor (hereinafter referred to simply as "Trb3") is connected to Vrefb through the second resistor Rbb1 (hereinafter referred to simply as "Rbb1") and Rbb2. The emitter of Trb3 is connected to the base of Trb2 to supply Trb2 with a bias current according to the reference voltage.

The collector of the fourth transistor (hereinafter referred to simply as "Trb4") is connected to Vrefb through the sixth resistor Rbb8 (hereinafter referred to simply as "Rbb8") and Rbb1. The emitter of Trb4 is grounded.

The collector of the fifth transistor (hereinafter referred to simply as "Trb5") is connected to the first power terminal (hereinafter referred to simply as "Vcb") to which a voltage is externally supplied. The emitter of Trb5 is connected to the base of Trb4. The base of Trb5 is connected to Vrefb through Rbb1 and Rbb10.

The collector of the sixth transistor (hereinafter referred to simply as "Trb6") is connected to the second power terminal (hereinafter referred to simply as "Vcb2") to which a voltage is externally supplied. The emitter of Trb6 is grounded. The base of Trb6 is connected to the emitter of Trb5 through Rbb12.

Description will next be made of the configuration of the current drive bias circuit shown in FIG. 1. The current drive bias circuit has the third resistor (hereinafter referred to simply as "Rbb9"). One end of Rbb9 is connected to Vrefb, while the other end of Rbb9 is connected to the base of Tr2a.

The fourth resistor Rb22 (hereinafter referred to simply as "Rb22") is provided between the base of Tr2a and a connecting point between Rbb9 and Trb1. A current Ib21 supplied from the above-described voltage drive bias circuit and a current Ib22 supplied from the current drive bias circuit are supplied to the base of Tr2a via Rb22.

In the circuit shown in FIG. 1, a linearizer L1 in which the fifth resistor RL1 (hereinafter referred to simply as "RL1") and the diode are connected in series is provided between the base of Tr2a and Rb22. The upper end of the linearizer L1 is connected between the base of Tr2a and Rb22. The other end of the linearizer L1 is connected to a grounding point.

The linearizer L1 has, between RL1 and the grounding point, the diode (base-collector diode) DL1 having an anode on the RL1 side and a cathode on the grounding point side.

The operations of the voltage drive bias circuit and the current drive bias circuit shown in FIG. 1 will be described. Trb1 of the voltage drive bias circuit is not turned on when the voltage applied to the base is lower than a predetermined threshold voltage (Vth1). That is, when the base voltage applied from Vrefb is lower than the threshold voltage (Vth1) at which the Trb1 is operable, Trb1 is not turned on. At this time, the first current (Ib22) is supplied from Vrefb to the base of Tr2a via Rbb9, i.e., the current drive bias circuit.

Trb1 of the voltage drive bias circuit is on when the voltage applied to the base is equal to or higher than the above-mentioned Vth1. In this state, Ib21 flows out of the emitter of Trb1. Ib21 is supplied from the emitter of Trb1 to Tr2a. That is, when the base voltage applied from Vrefb is equal to or higher than Vth1, the second current (Ib21) is supplied form Vrefb to the base of Tr2a via the voltage drive circuit in addition to the first current (Ib22).

Further, Tr2b is provided in parallel with Tr2a in the circuit shown in FIG. 1. The seventh resistor Rbb13 (hereinafter referred to simply as "Rbb13") is connected between the base of Tr2b and Vrefb. Each of the collectors of Tr2a and Tr2b is connected to the power terminal Vc2. The bases of these transistors are connected to each other through the capacitance element Ca.

A third current (Ib23) is supplied from Vrefb to the base of Tr2b through Rbb13. When the base voltage on the Tr2b is equal to or higher than a threshold voltage (Vth2) at which the Tr2b is operable, Tr2b is on. That is, Tr2b is turned on/off by the bias current according to the reference voltage.

In the first embodiment, Rbb9 and Rb22 are provided on the Tr2a base side, and the linearizer L1 in which RL1 and DL1 are connected in series is provided between the base of Tr2a and Rb22.

In the above-described configuration, a smoothed current flows through the diode DL1 when the RF input power is increased, thereby shifting the bias point and changing the on resistance of DL1. In the case of the linearizer L1 shown in FIG. 1, the resistance of DL1 is changed from a lower value to a higher value. Accordingly, the relationship between the gain Gp and input power Pin exhibited by the diode linearizer is as shown in FIG. 2.

Figure 2:
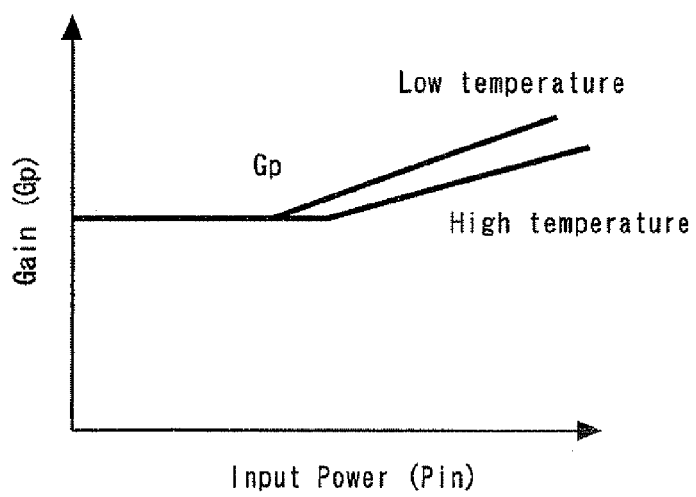
FIG. 2 shows the relationship between the gain Gp and input power Pin exhibited by the diode linearizer.
Figure 3:
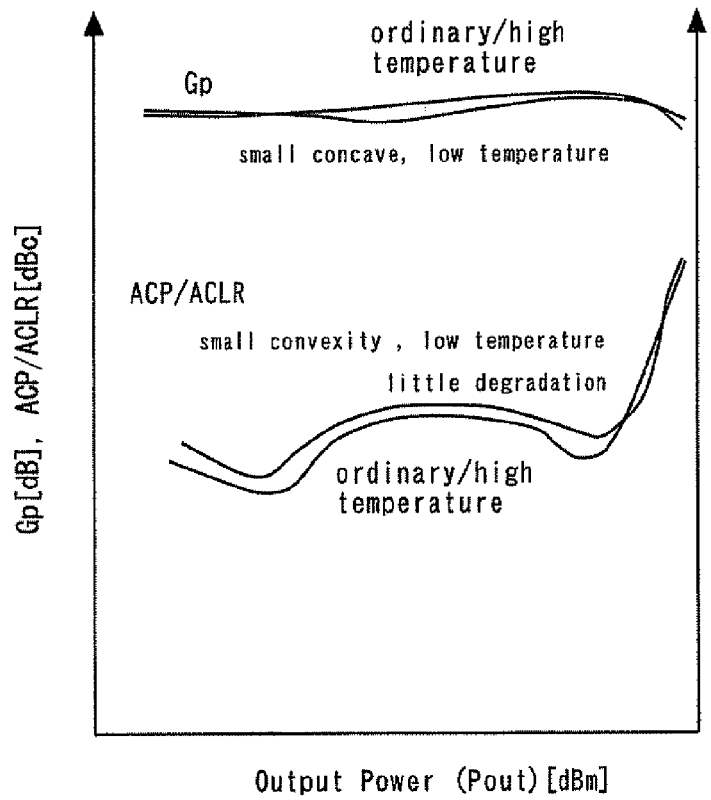
FIG. 3 shows characteristics of the power amplifier in gain Gp and the distortion.
Figure 14:
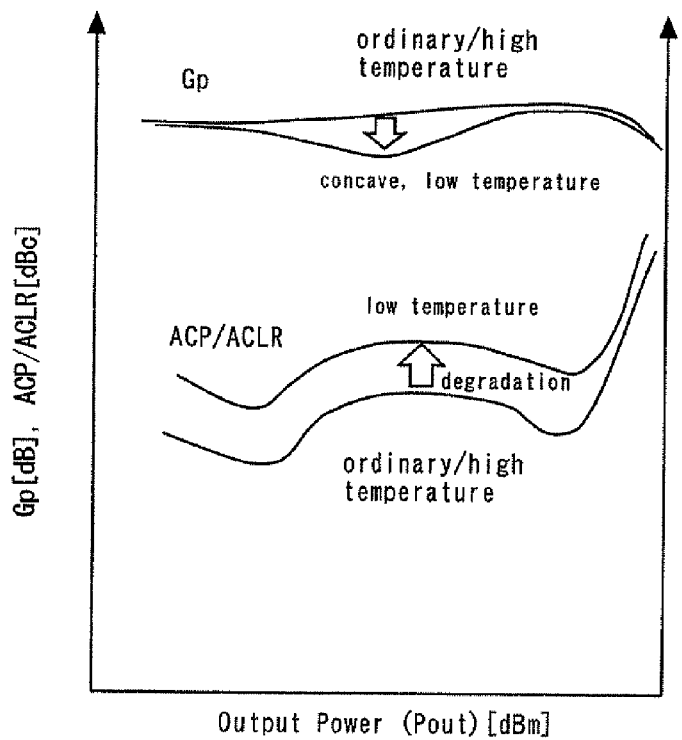
FIG. 14 shows characteristics of the power amplifier in gain Gp and the distortion of the previous invention.

As shown in FIG. 2, the gain Gp tends to increase at a higher rate with the increase in input power Pin, if the temperature is reduced. The diode size of DL1, the resistance values of Rbb9 and RL1 and the bias current through DL1 are specified so as to compensate for a reduction in gain Gp such as shown in FIG. 14, thus making compensation for a reduction in gain Gp and a degradation in distortion characteristics at a low temperature, as shown in FIG. 3.

Further, the linearizer L1 can be directly inserted on the Tr2a base side in a DC manner without AC coupling using elements including a capacitor, as shown in FIG. 1. Thus, the linearizer L1 can be provided with substantially no increase in circuit size. The idling current Ic2a through Tr2a is determined by Rbb9, Rb22 and L1. When the idling current Ic2a flows, the base voltage of the Tr2a is determined by the ratio of Rbb9 and RL1. Therefore, variation in Ic2a due to resistance variation can be limited.

In the configuration according to the first embodiment, a bias circuit for a power amplifier capable of low-bias operation at a reference voltage of 2.4 to 2.5 V can be obtained. Also, the configuration according to the first embodiment ensures that compensation can be made for a reduction in gain Gp and a degradation in distortion characteristics at a low temperature, such as those observed in the related art, and that variation in idling current due to variation in resistance can be limited. Further, since a linearizer can be provided in a direct connection to the base of the power transistor in a DC manner, the increase in circuit size can be effectively limited.

In the configuration of the bias circuit and the power transistors incorporating the diode linearizer according to the first embodiment, the linearizer L1 is capable of compensating for the drawback of the tendency of distortion characteristics to degrade at a low temperature in some case, while functioning as a bias circuit for the voltage/current drive power transistor stage. In this respect, the circuit of the present invention differs from the simple combination of a diode linearizer and an amplifier reported with respect to the conventional art.

Second Embodiment

Figure 4:
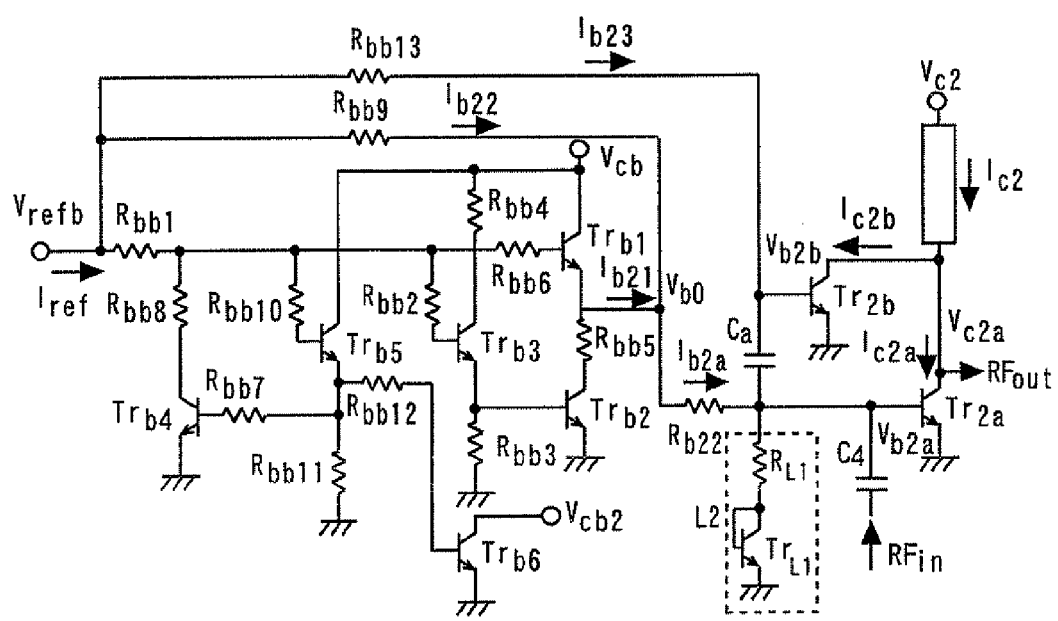
FIG. 4 shows a configuration of a power amplifier and a bias circuit for the power amplifier according to the second embodiment.

FIG. 4 shows an example of a configuration of a power amplifier and a bias circuit for the power amplifier according to the second embodiment of the present invention. Description will be mainly made of points of difference from the first embodiment.

In the circuit shown in FIG. 4, a linearizer L2 is provided in place of the linearizer L1 in the circuit shown in FIG. 1. In the linearizer L2, a base-collector short-circuit transistor TrL1 is provided as a seventh transistor in place of the diode DL1 shown in the first embodiment.

That is, the linearizer L2 has the seventh transistor (hereinafter referred to as "TrL1") between RL1 and the grounding point; the base and collector of this transistor are connected to RL1; and the emitter of this transistor is connected to the grounding point. In other respects, the configuration is the same as that in the first embodiment.

The base-collector (BC) withstand voltage of the base-collector diode (DL1) in the first embodiment is ordinarily 20 V or higher. On the other hands the emitter-base (EB) withstand voltage of TrL1 shown in FIG. 4 is ordinarily 10 V or lower. To enable the same operation as that in the first embodiment, the circuit constants in the circuit shown in FIG. 4 are reset.

According to the second embodiment, the same advantages as those of the first embodiment can be obtained.

Third Embodiment

Figure 5:
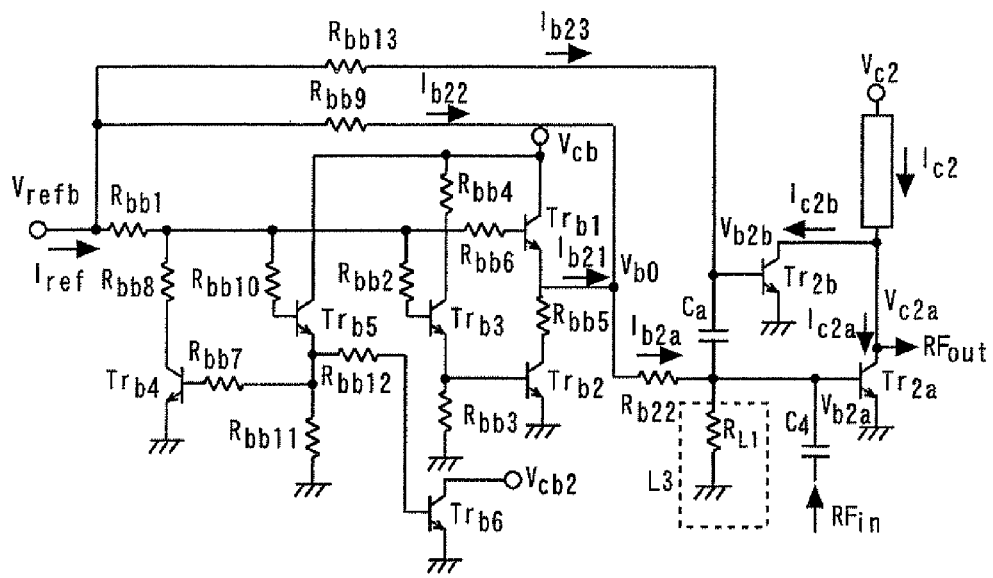
FIG. 5 shows a configuration of a power amplifier and a bias circuit for the power amplifier according to the third embodiment.

FIG. 5 shows an example of a configuration of a power amplifier and a bias circuit for the power amplifier according to the third embodiment of the present invention. Description will be mainly made of points of difference from the first embodiment.

In the circuit shown in FIG. 5, a linearizer L3 formed only of RL1 is provided in place of the linearizer L1 shown in FIG. 1. In other respects, the configuration is the same as that in the first embodiment.

Since the above-described linearizer is formed only of a resistance element, a high gain compensation effect such as that obtained in the first or second embodiment cannot be obtained. However, the above-described configuration ensures that a reduction in gain Gp at a low temperature, such as that shown in FIG. 14, can be reduced and degradation in distortion characteristics can be limited. Other advantages of this embodiment are the same as those of the first and second embodiment.

Fourth Embodiment

Figure 6:
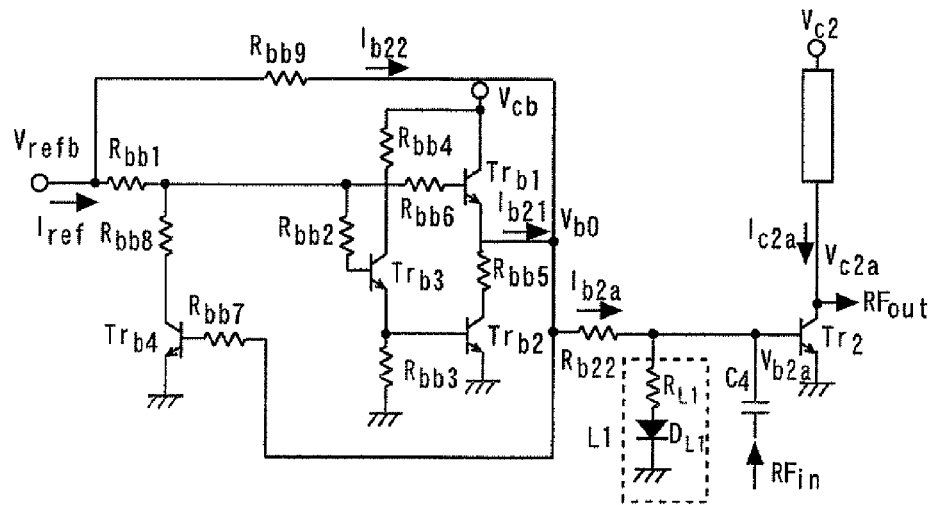
FIG. 6 shows a configuration of a power amplifier and a bias circuit for the power amplifier according to the fourth embodiment.

FIG. 6 shows an example of a configuration of a power amplifier and a bias circuit for the power amplifier according to the fourth embodiment of the present invention. Description will be mainly made of points of difference from the first embodiment.

In the circuit shown in FIG. 6, Tr2$b$, Rbb13 and the capacitance element Ca shown in FIG. 1 are not provided. While in the circuit shown in FIG. 1 the bias voltage of the emitter follower portion (Trb1, Trb2) at a high temperature is reduced by the third to sixth transistors (Trb3 to Trb6), the configuration of the third to six transistors in the circuit shown in FIG. 6 is simplified.

The configuration of the voltage drive bias circuit shown in FIG. 6 is such that the base of Trb4 is connected to the base of Tr2 through Rb22, and Trb5 and Trb6 are removed. In other respects, the configuration is the same as that in the first embodiment.

The circuit configured as described above is inferior to the circuit described above in the description of the first embodiment with reference to FIG. 1 in terms of operation margin (reference voltage and temperature characteristics) when the reference voltage Vref is low. However, the provision of the linearizer L1 ensures an improvement in operation margin in distortion characteristics at a low temperature.

The above-described circuit configuration is markedly simplified in comparison with that shown in FIG. 1 and can therefore be implemented in a reduced circuit size. Therefore, this circuit can be used in a case where the requirements of the specifications of the power amplifier (the Vref voltage range and distortion characteristic levels) are comparatively relaxed. Other advantages of this embodiment are the same as those of the first embodiment, Fifth Embodiment The configuration of a power amplifier and a bias circuit according to the fifth embodiment of the present invention is such that the linearizer L1 described in the description of the fourth embodiment with reference to FIG. 6 is replaced with the linearizer L2 described in the description of the second embodiment with reference to FIG. 4. In other respects, the configuration is the same as that in the fourth embodiment.

The above-described configuration ensures the same advantages as those of the fourth embodiment.

Sixth Embodiment

The configuration of a power amplifier and a bias circuit according to the sixth embodiment of the present invention is such that the linearizer L1 described in the description of the fourth embodiment with reference to FIG. 6 is replaced with the linearizer L3 described in the description of the third embodiment with reference to FIG. 5. In other respects, the configuration is the same as that in the fourth embodiment.

The distortion limitation effect at a low temperature achieved in the case of using the above-described configuration is slightly lower than those in the fourth and fifth embodiments. In other respects, the same advantages as those of the fourth embodiment can be obtained.

Seventh Embodiment

Figure 7:
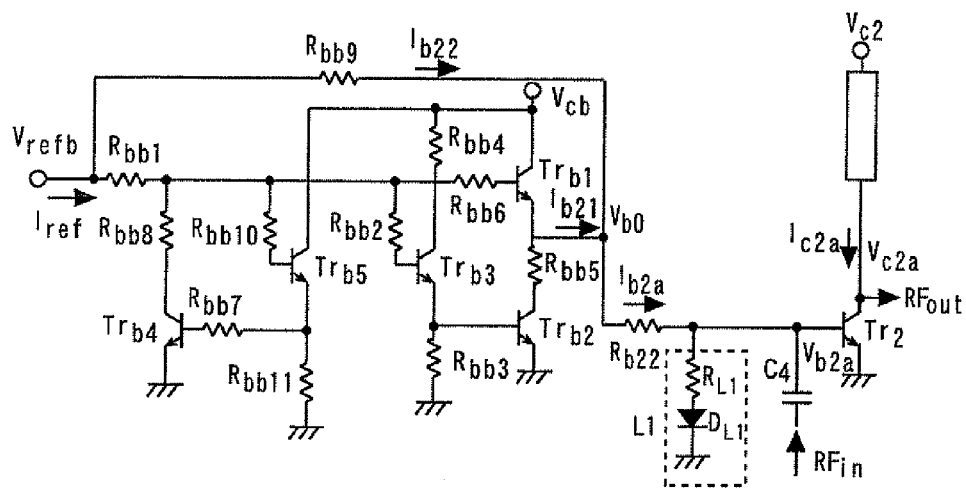
FIG. 7 shows a configuration of a power amplifier and a bias circuit for the power amplifier according to the seventh embodiment.

FIG. 7 shows a configuration of a power amplifier and a bias circuit for the power amplifier according to the seventh embodiment of the present invention. Description will be mainly made of points of difference from the first embodiment.

In the circuit shown in FIG. 7, Tr2$b$, Rbb13 and the capacitance element Ca shown in FIG. 1 are not provided. Also, Trb6 and Rbb12 are not provided. The base of Trb4 is connected to the base of Tr2 through Trb1 and Trb5. In other respects, the configuration is the same as that in the first embodiment.

In the above-described circuit, the base of Trb4 is not directly connected to the base of Tr2. Therefore, a high-temperature compensation section constituted by Trb4, Rbb8 and Rbb7 can be provided separately from Tr2 with respect to RF conditions. As a result, the influence of the high-temperature compensation section on RF characteristics can be reduced.

The circuit configured as described above is inferior to the circuit described above in the description of the first embodiment with reference to FIG. 1 in terms of operation margin (reference voltage and temperature characteristics) when the reference voltage Vref is low. However, the provision of the linearizer L1 ensures an improvement in operation margin in distortion characteristics at a low temperature.

The above-described circuit configuration is simplified in comparison with that shown in FIG. 1 and can therefore be implemented in a reduced circuit size. Other advantages of this embodiment are the same as those of the fourth embodiment.

Eighth Embodiment

The configuration of a power amplifier and a bias circuit for the power amplifier according to the eighth embodiment of the present invention is such that the linearizer L1 described in the description of the seventh embodiment with reference to FIG. 7 is replaced with the linearizer L2 described in the description of the second embodiment with reference to FIG. 4. In other respects, the configuration is the same as that in the seventh embodiment.

The above-described configuration ensures the same advantages as those of the seventh embodiment.

Ninth Embodiment

The configuration of a power amplifier and a bias circuit for the power amplifier according to the ninth embodiment of the present invention is such that the linearizer L1 described in the description of the seventh embodiment with reference to FIG. 7 is replaced with the linearizer L3 described in the description of the third embodiment with reference to FIG. 5. In other respects, the configuration is the same as that in the seventh embodiment.

The distortion limitation effect at a low temperature achieved in the case of using the above-described configuration is slightly lower than those in the seventh and eighth embodiments. In other respects, the same advantages as those of the seventh embodiment can be obtained.

Tenth Embodiment

Figure 8:
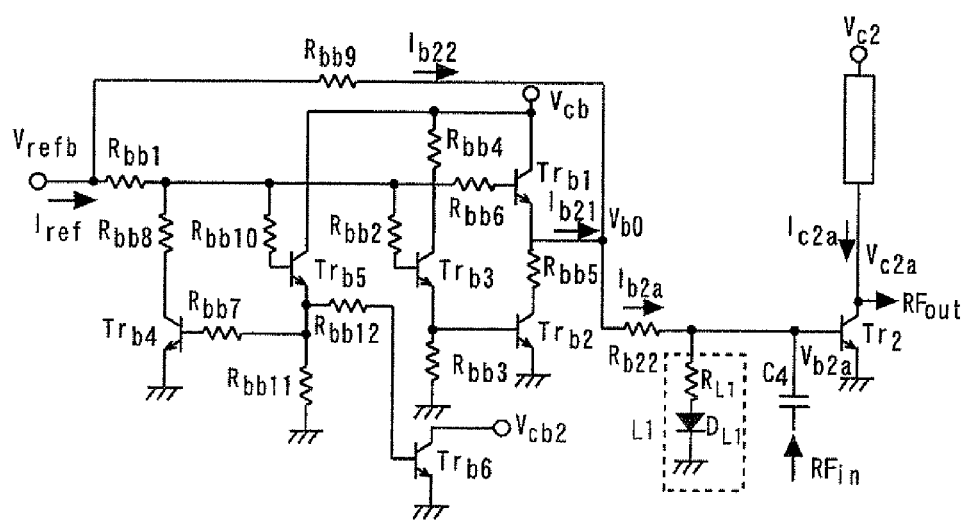
FIG. 8 shows a configuration of a power amplifier and a bias circuit for the power amplifier according to the tenth embodiment.

FIG. 8 shows a configuration of a power amplifier and a bias circuit for the power amplifier according to the tenth embodiment of the present invention. Description will be mainly made of points of difference from the first embodiment.

In the circuit shown in FIG. 8, Tr2b, Rbb13 and the capacitance element Ca shown in FIG. 1 are not provided. That is, the circuit elements related to Tr2b are removed. In other respects, the configuration is the same as that in the first embodiment.

The circuit configured as described above is inferior to the circuit described above in the description of the first embodiment with reference to FIG. 1 in terms of operation margin (reference voltage and temperature characteristics) when the reference voltage Vref is low. However, the provision of the linearizer L1 ensures an improvement in operation margin in distortion characteristics at a low temperature.

Since Tr2b shown in FIG. 1 and the portions related to Tr2b are removed, the circuit of this embodiment can be implemented in a reduced circuit size in comparison with the first embodiment. In other respects, the same advantages as those of the first embodiment can be obtained.

Eleventh Embodiment

The configuration of a power amplifier and a bias circuit for the power amplifier according to the eleventh embodiment of the present invention is such that the linearizer L1 described in the description of the tenth embodiment with reference to FIG. 8 is replaced with the linearizer L2 described in the description of the second embodiment with reference to FIG. 4. In other respects, the configuration is the same as that in the tenth embodiment.

The above-described configuration ensures the same advantages as those of the tenth embodiment.

Twelfth Embodiment

The configuration of a power amplifier and a bias circuit for the power amplifier according to the twelfth embodiment of the present invention is such that the linearizer L1 described in the description of the tenth embodiment with reference to FIG. 8 is replaced with the linearizer L3 described in the description of the third embodiment with reference to FIG. 5. In other respects, the configuration is the same as that in the tenth embodiment.

The distortion limitation effect at a low temperature achieved in the case of using the above-described configuration is slightly lower than those in the tenth and eleventh embodiments. In other respects, the same advantages as those of the tenth embodiment can be obtained.

Thirteenth Embodiment

Figure 9:
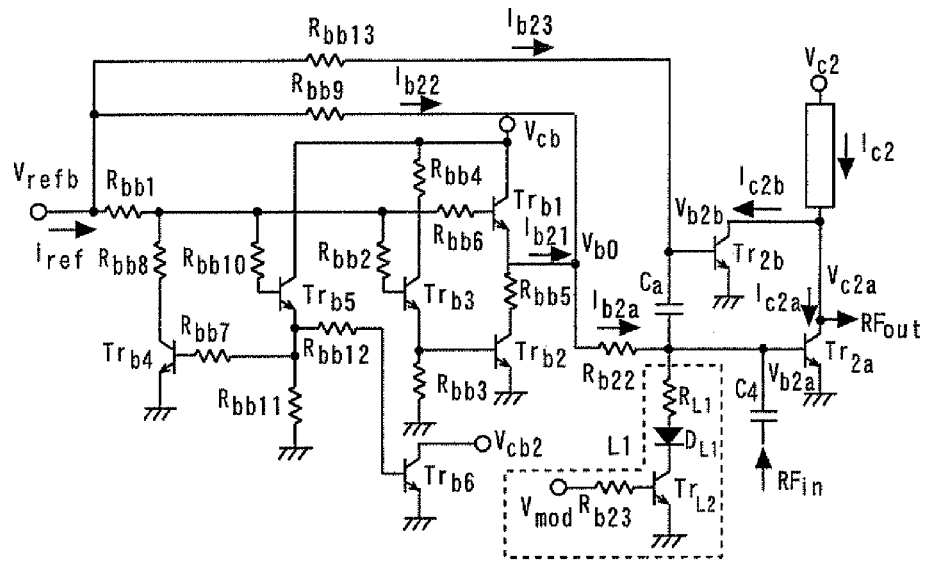
FIG. 9 shows a configuration of a power amplifier and a bias circuit for the power amplifier according to the thirteenth embodiment.

FIG. 9 shows a configuration of a power amplifier and a bias circuit for the power amplifier according to the thirteenth embodiment of the present invention. Description will be mainly made of points of difference from the first embodiment.

A linearizer L1 shown in FIG. 9 is such that an eighth transistor TrL2, an eighth resistor Rb23 and a control terminal Vmod are added to the linearizer L1 shown in FIG. 1. That is, this linearizer L1 has the eighth transistor TrL2 (hereinafter referred to simply as "TrL2") between the cathode of the diode (DL1) and the grounding point.

The base of TrL2 is connected to the control terminal (Vmod) through the eighth resistor Rb23 (hereinafter referred to simply as "Rb23"). To the control terminal, a control voltage for turning on/off the linearizer L1 is externally applied.

The collector of TrL2 is connected to the cathode of the diode DL1, while the emitter is connected to the grounding point.

In the first to twelfth embodiments, the linearizer is operated at any temperature. In the thirteenth embodiment, the linearizer L1 is operated at low and ordinary temperatures. For example, at temperatures (low and ordinary temperatures) lower than a predetermined temperature, "High" (a voltage equal to or higher than about 1.4 V) is applied to the control terminal Vmod to operate the linearizer L1. At a (high) temperature higher than the predetermined temperature, "Low" (a voltage equal to or lower than about 1 V) is applied to the control terminal Vmod to stop the operation of the linearizer L1.

That is, when the temperature of the bias circuit for a power amplifier shown in FIG. 9 is lower than the predetermined temperature, a voltage equal to or higher than the threshold voltage of TrL2 is applied from the control terminal Vmod to the base of TrL2 to turn on the linearizer L1. When the temperature of the bias circuit for a power amplifier shown in FIG. 9 is equal to or higher than the predetermined temperature, a voltage lower than the threshold voltage of TrL2 is applied from the control terminal Vmod to the base of TrL2 to turn off the linearizer L1.

The above-described configuration enables the idle current (the bias current through Tr2a and Tr2b, i.e., Ic2 shown in FIG. 9, when no RF input is provided), constantly maintained through the entire temperature range in the first to twelfth embodiments, to be increased at a high temperature.

This is because, at a high temperature, the entire Ib2a shown in FIG. 9 flows through the base of the Tr2a without flowing through the diode DL1. As a result, the idling current through the Tr2a at high temperatures can be increased. Consequently, according to the thirteenth embodiment, compensation can be made for a reduction in gain Gp ordinarily caused at a high temperature. Other advantages of this embodiment are the same as those of the first embodiment.

Fourteenth Embodiment

The configuration of a power amplifier and a bias circuit for the power amplifier according to the fourteenth embodiment of the present invention is such that the linearizer L1 described in the description of the fourth embodiment with reference to FIG. 6 is replaced with the linearizer L1 described in the description of the thirteenth embodiment with reference to FIG. 9. In other respects, the configuration is the same as that in the fourth embodiment.

The above-described configuration ensures the same advantages as those of the thirteenth embodiment as well as those of the fourth embodiment.

Fifteenth Embodiment

The configuration of a power amplifier and a bias circuit for the power amplifier according to the fifteenth embodiment of the present invention is such that the linearizer L1 described in the description of the seventh embodiment with reference to FIG. 7 is replaced with the linearizer L1 described in the description of the thirteenth embodiment with reference to FIG. 9. In other respects, the configuration is the same as that in the seventh embodiment.

The above-described configuration ensures the same advantages as those of the thirteenth embodiment as well as those of the seventh embodiment.

Sixteenth Embodiment

The configuration of a power amplifier and a bias circuit for the power amplifier according to the sixteenth embodiment of the present invention is such that the linearizer L1 described in the description of the tenth embodiment with reference to FIG. 8 is replaced with the linearizer L1 described in the description of the thirteenth embodiment with reference to FIG. 9. In other respects, the configuration is the same as that in the tenth embodiment.

The above-described configuration ensures the same advantages as those of the thirteenth embodiment as well as those of the tenth embodiment.

Seventeenth Embodiment

Figure 10:
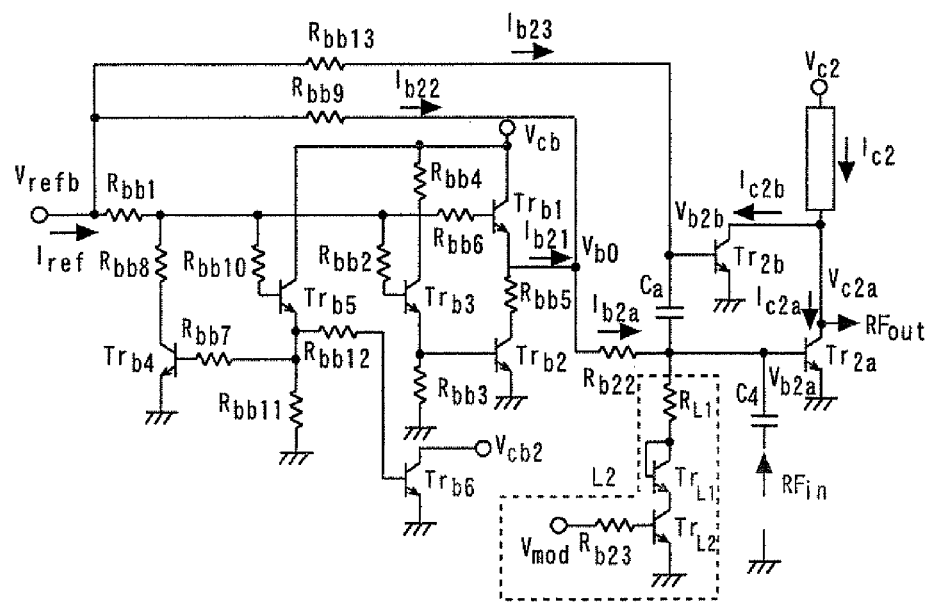
FIG. 10 shows a configuration of a power amplifier and a bias circuit for the power amplifier according to the seventeenth embodiment.
Figure 11:
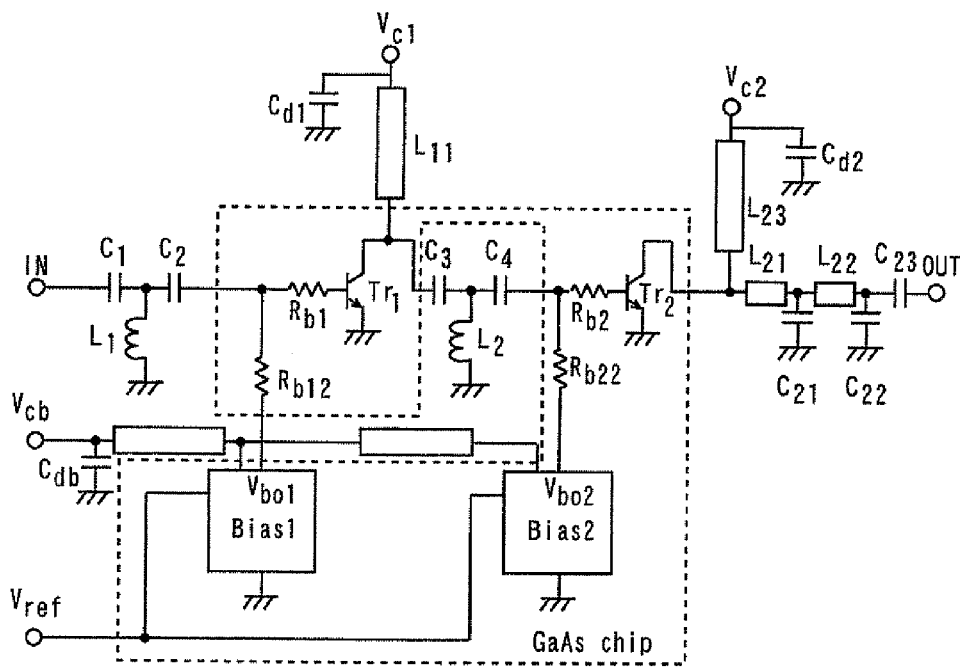
FIG. 11 shows a configuration of a power amplifier and a bias circuit for the power amplifier of a prior art.
Figure 12:
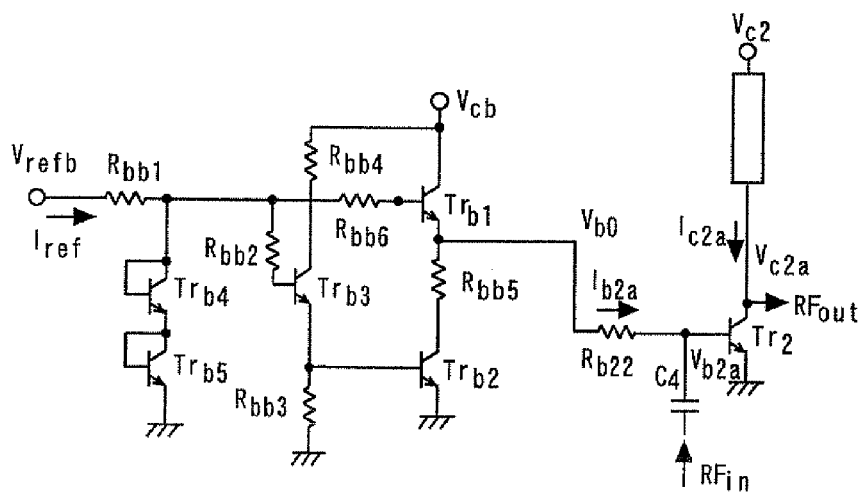
FIG. 12 shows a concrete example of a circuit configuration of the bias circuit in FIG. 11.

FIG. 10 shows a configuration of a power amplifier and a bias circuit for the power amplifier according to the seventeenth embodiment of the present invention. Description will be mainly made of points of difference from the second and thirteenth embodiments.

A linearizer L2 shown in FIG. 10 is such that TrL2, an eighth resistor Rb23 and a control terminal Vmod are added to the linearizer L2 shown in FIG. 4, as in the thirteenth embodiment. That is, this linearizer L2 has TrL2 between the emitter of TrL1 and the grounding point.

The base of TrL2 is connected to the control terminal (Vmod) through Rb23. To this control terminal, a control voltage for turning on/off the linearizer L2 is externally applied. The collector of TrL2 is connected to the emitter of TrL1, while the emitter of TrL2 is connected to the grounding point. In other respects, the configuration is the same as that in the thirteenth embodiment.

The seventeenth embodiment ensures the same advantages as those of the thirteenth embodiment.

Eighteenth Embodiment

The configuration of a power amplifier and a bias circuit for the power amplifier according to the eighteenth embodiment of the present invention is such that the linearizer L1 described in the description of the fourth embodiment with reference to FIG. 6 is replaced with the linearizer L2 described in the description of the seventeenth embodiment with reference to FIG. 10. In other respects, the configuration is the same as that in the fourth embodiment.

The above-described configuration ensures the same advantages as those of the seventeenth embodiment as well as those of the fourth embodiment.

Nineteenth Embodiment

The configuration of a power amplifier and a bias circuit for the power amplifier according to the nineteenth embodiment of the present invention is such that the linearizer L1 described in the description of the seventh embodiment with reference to FIG. 7 is replaced with the linearizer L2 described in the description of the seventeenth embodiment with reference to FIG. 10. In other respects, the configuration is the same as that in the seventeenth embodiment.

The above-described configuration ensures the same advantages as those of the seventeenth embodiment as well as those of the seventh embodiment.

Twentieth Embodiment

The configuration of a power amplifier and a bias circuit for the power amplifier according to the twentieth embodiment of the present invention is such that the linearizer L1 described in the description of the tenth embodiment with reference to FIG. 8 is replaced with the linearizer L2 described in the description of the thirteenth embodiment with reference to FIG. 10. In other respects, the configuration is the same as that in the tenth embodiment.

The above-described configuration ensures the same advantages as those of the seventeenth embodiment as well as those of the tenth embodiment.

In the bias circuit for a power amplifier according to the first to twentieth embodiments, as described above, a voltage drive bias circuit including an element such as an emitter follower and a current drive bias circuit for directly applying a current from a reference voltage input terminal to a base through a high-resistance element are provided in parallel with each other (as a combined bias circuit) for Tr or Tr2a. Alternatively, Tr2b operated only by current drive is provided in parallel with Tr2a driven by the combined bias circuit.

The above-described configuration ensures that a GaAs-HBT power amplifier can be obtained which is capable of performing the desired amplifying operation even by a reference voltage Vref lower than twice the barrier voltage of HBTs, more specifically 2.4 to 2.5 V, while generally constantly maintaining an idling current from a low temperature to a high temperature, and which is formed on a GaAs chip integrally with a bias circuit. In this amplifier, a degradation in distortion characteristics at a low temperature can be limited. Further, in a case where a switch using a control terminal Vmod is added to a linearizer, compensation can be made for a reduction in gain at a high temperature by turning on/off the linearizer according to temperature.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No, 2006-146061, filed on May 26, 2006 including specification, claims, drawings and summary, on which the Convention priority of the present application is based, are incorporated herein by reference in its entirety.

The invention claimed is:

1. A bias circuit for power amplification comprising:
   a first amplifying transistor having a base;
   a voltage drive bias circuit connected to the base of the first amplifying transistor;
   a reference voltage input terminal connected to the voltage drive bias circuit and to which a reference voltage is externally supplied, wherein the voltage drive bias circuit includes
   a first transistor having an emitter and supplying a bias current according to the reference voltage to the base of the first amplifying transitor,
   first and second resistors,
   a second transistor having an emitter that is grounded, a base, and a collector that is connected to a point between the emitter of the first transistor and the base of the first amplifying transistor through the first resistor,
   a third transistor having a base connected to the reference voltage input terminal through the second resistor, supplying a bias current according to the reference voltage to the base of the second transistor, and a third resistor having a first end connected to the reference voltage input terminal, and having a second end connected to the base of the first amplifying transistor;

a fourth resistor provided between the base of the first amplifying transistor and a connecting point between the third resistor and the first transistor;

a linearizer including a fifth resistor, the fifth resistor having a first end connected between the fourth resistor and the base of the first amplifying transistor, and having a second end connected to a grounding point, wherein when the base voltage applied from the reference voltage input terminal is lower than a threshold voltage at which the first transistor is operable, a first current is supplied from the reference voltage input terminal to the base of the first amplifying transistor through the third resistor, and when the base voltage applied from the reference voltage input terminal is equal to or higher than the threshold voltage, a second current is supplied from the reference voltage input terminal to the base of the first amplifying transistor through the voltage drive circuit in addition to the first current.

2. The bias circuit for power amplification according to claim 1, further comprising:

a sixth resistor connected to the reference voltage input terminal; and a fourth transistor having a base, a collector that is connected to the sixth resistor, and an emitter that is grounded.

3. The bias circuit for power amplification according to claim 2, wherein:

the base of the fourth transistor is connected to the fourth resistor, and the fourth resistor is connected to the base of the first amplifying transistor.

4. The bias circuit for power amplification according to claim 2, further comprising:

a first power terminal to which a voltage is externally supplied; and a fifth transistor having a collector that is connected to the first power terminal, an emitter that is connected to the base of the fourth transistor, and a base that is connected to the reference voltage input terminal.

5. The bias circuit for power amplification according to claim 4, wherein:

the collector of the fourth transistor is connected to the first transistor and the fifth transistor; and the first transistor and the fifth resistor are connected to the base of the first amplifying transistor.

6. The bias circuit for power amplification according to claim 4, further comprising:

a second power terminal to which a voltage is externally supplied; and a sixth transistor having a collector that is connected to the second power terminal, an emitter that is grounded, and a base that is connected to the emitter of the fifth transistor.

7. The bias circuit for power amplification according to claim 5, further comprising:

a second power terminal to which a voltage is externally supplied; and a sixth transistor having a collector that is connected to the second power terminal, an emitter that is grounded, and a base that is connected to the emitter of the fifth transistor.

8. The bias circuit for power amplification according to claim 6, further comprising:

a second amplifying transistor having a base and provided in parallel with the first amplifying transistor;

a seventh resistor connected between the base of the second amplifying transistor and the reference voltage input terminal, wherein a third current is supplied from the reference voltage input terminal to the base of the second amplifying transistor through the seventh resistor, and the second amplifying transistor is turned on when the base voltage of the second amplifying transistor is equal to or higher than a threshold voltage at which the second amplifying transistor is operable.

9. The bias circuit for power amplification according to claim 1, wherein the linearizer has a diode including a cathode and provided between the fifth resistor and the grounding point, the cathode of the diode being on the grounding point side.

10. The bias circuit for power amplification according to claim 1, wherein:

the linearizer has a fourth transistor having an emitter and a base and connected between the fifth resistor and the grounding point;

the base and the collector of the fourth transistor are connected to the fifth resistor; and the emitter of the fourth transistor is connected to the grounding point.

11. The bias circuit for power amplification according to claim 1, wherein the linearizer consists of the fifth resistor.

12. The bias circuit for power amplification according to claim 9, wherein:

the linearizer includes a sixth resistor and a fourth transistor having an emitter, a base, and a collector and provided between the diode and the grounding point, the base of the fourth transistor is connected to a control terminal through the sixth resistor, the collector of the fourth transistor is connected to the cathode of the diode, and the emitter of the fourth transistor is connected to the grounding point;

when the temperature of the bias circuit for power amplification is lower than a predetermined temperature, a voltage equal to or higher than a threshold voltage of the fourth transistor is applied from the control terminal to the base of the fourth transistor to turn on the linearizer; and when the temperature of the bias circuit for power amplification is equal to or higher than the predetermined temperature, a voltage lower than the threshold voltage is applied from the control terminal to the base of the fourth transistor to turn off the linearizer.

13. The bias circuit for power amplification according to claim 10, wherein:

the linearizer has includes a sixth resistor and a fifth transistor having an emitter, a base, and a collector and provided between the fourth transistor and the grounding point, the base of the fifth transistor is connected to a control terminal through the sixth resistor, the collector of the fifth transistor is connected to the emitter of the fourth transistor, and the emitter of the fifth transistor is connected to the grounding point;

when the temperature of the bias circuit for power amplification is lower than a predetermined temperature, a voltage equal to or higher than a threshold voltage of the fifth transistor is applied from the control terminal to the base of the fifth transistor to turn on the linearizer; and when the temperature of the bias circuit for power amplification is equal to or higher than the predetermined temperature, a voltage lower than the threshold voltage is applied from the control terminal to the base of the fifth transistor to turn off the linearizer.

* * * * *